US012727075B2

(12) United States Patent
Chang et al.

(10) Patent No.: US 12,727,075 B2
(45) Date of Patent: Sep. 1, 2026

(54) ELECTRONIC DEVICE

(71) Applicant: Innolux Corporation, Miaoli County (TW)

(72) Inventors: Mu-Fan Chang, Miaoli County (TW); Yi-Hua Hsu, Miaoli County (TW); Hung-Sheng Liao, Miaoli County (TW); Min-Hsin Lo, Miaoli County (TW); Ming-Chun Tseng, Miaoli County (TW); Ker-Yih Kao, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 418 days.

(21) Appl. No.: 18/467,720

(22) Filed: Sep. 14, 2023

(65) Prior Publication Data

US 2024/0147606 A1 May 2, 2024

Related U.S. Application Data

(60) Provisional application No. 63/419,338, filed on Oct. 26, 2022.

(30) Foreign Application Priority Data

Aug. 2, 2023 (CN) ......................... 202310965292.1

(51) Int. Cl.

*H05K 1/02* (2006.01)
*H10W 42/60* (2026.01)
*H10W 72/90* (2026.01)

(52) U.S. Cl.

CPC .......... *H05K 1/0259* (2013.01); *H10W 42/60* (2026.01); *H05K 2201/10128* (2013.01); *H10W 72/932* (2026.01)

(58) Field of Classification Search

CPC ..................... H01L 23/60; H01L 24/05; H01L 2224/05552; H01L 2924/30205;

(Continued)

(56) References Cited

U.S. PATENT DOCUMENTS 4,782,381 A * 11/1988 Ruby .................... H01L 23/538 361/792
6,025,631 A * 2/2000 Lin ......................... H01L 23/60 257/E23.079
2013/0107075 A1* 5/2013 Kobayashi ............. H10K 65/00 348/222.1

FOREIGN PATENT DOCUMENTS

CN 117440718 1/2024

* cited by examiner

*Primary Examiner* — Kevin J Comber
(74) *Attorney, Agent, or Firm* — JCIPRNET

(57) ABSTRACT

An electronic device includes a first substrate structure, multiple electronic elements and a second substrate structure. The first substrate structure includes a first substrate. The electronic elements are disposed on the first substrate. The second substrate structure is coupled to the first substrate structure. The second substrate structure includes a second substrate, a protection circuit, a driving circuit and a bonding pad. The protection circuit is disposed on the second substrate. The driving circuit is disposed on the second substrate and configured to drive at least a part of the electronic elements. The bonding pad is disposed on the second substrate. The protection circuit is respectively coupled to the bonding pad and the driving circuit. The electronic device may reduce the damage caused by electrostatic discharge or reduce the impact of the bonding process of the bonding pad on signal conduction.

20 Claims, 9 Drawing Sheets

(58) Field of Classification Search
CPC ....... H05K 1/0259; H05K 2201/10128; H10D 86/40; H10D 86/60; H10D 89/60; H10D 89/611; H10D 89/811
USPC .......................................................... 361/56
See application file for complete search history.

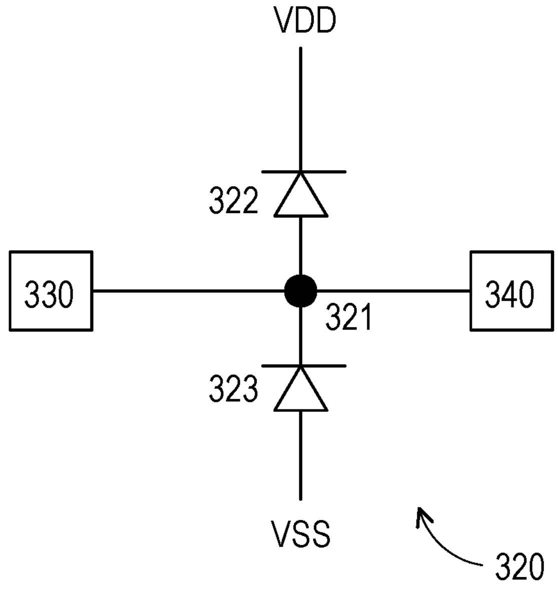
FIG. 4A
VDD
322a
330
321
340
323a
VSS
320a
FIG. 4B
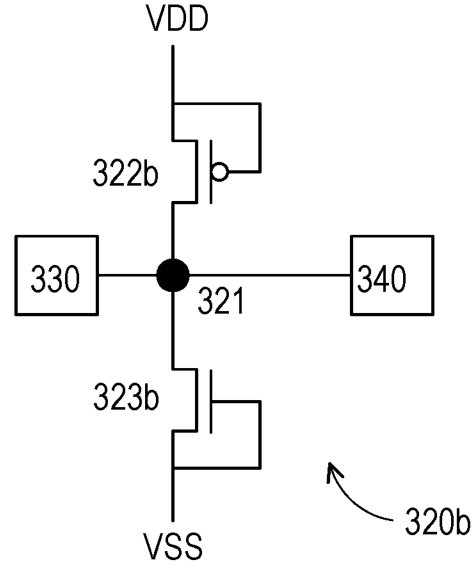
FIG. 4C
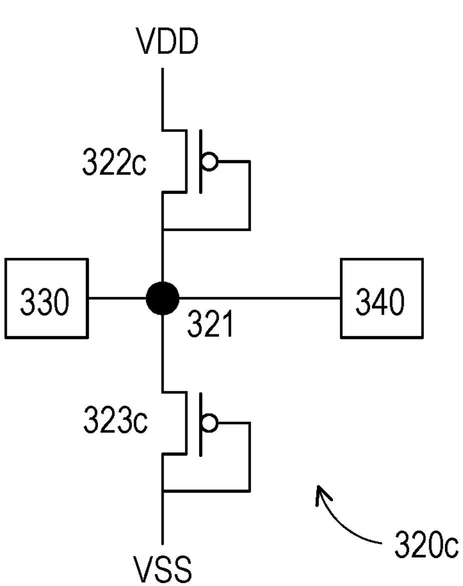
FIG. 4D

ELECTRONIC DEVICE

CROSS-REFERENCE TO RELATED APPLICATION

This application claims the priority benefits of U.S. provisional application Ser. No. 63/419,338, filed on Oct. 26, 2022, and China application serial no. 202310965292.1, filed on Aug. 2, 2023. The entirety of each of the above-mentioned patent applications is hereby incorporated by reference herein and made a part of this specification.

BACKGROUND

Technical Field

The disclosure relates to an electronic device, in particular to an electronic device capable of reducing damage caused by electrostatic discharge or reducing the impact of a bonding process of a bonding pad on signal conduction.

Description of Related Art

Electronic devices or spliced electronic devices have been widely used in different fields such as communications, display, automobile or aviation. With the vigorous development of electronic devices, the development of electronic devices is becoming thinner and lighter, so the requirements for reliability or quality of electronic devices are higher.

SUMMARY

The disclosure provides an electronic device, which may reduce the damage caused by electrostatic discharge or reduce the impact of the bonding process of the bonding pad on signal conduction.

According to an embodiment of the disclosure, an electronic device includes a first substrate structure, multiple electronic elements and a second substrate structure. The first substrate structure includes a first substrate. The electronic elements are disposed on the first substrate. The second substrate structure is coupled to the first substrate structure. The second substrate structure includes a second substrate, a protection circuit, a driving circuit and a bonding pad. The protection circuit is disposed on the second substrate. The driving circuit is disposed on the second substrate and configured to drive at least a part of the electronic elements. The bonding pad is disposed on the second substrate. The protection circuit is respectively coupled to the bonding pad and the driving circuit.

BRIEF DESCRIPTION OF THE DRAWINGS

The accompanying drawings are included to provide a further understanding of the disclosure, and are incorporated in and constitute a part of the specification. The drawings illustrate the embodiments of the disclosure and, together with the description, serve to explain the principles of the disclosure.

FIGS. 4A to 4D are schematic circuit diagrams of protection circuits in electronic devices according to various embodiments of the disclosure.

DESCRIPTION OF THE EMBODIMENTS

Figure 1:
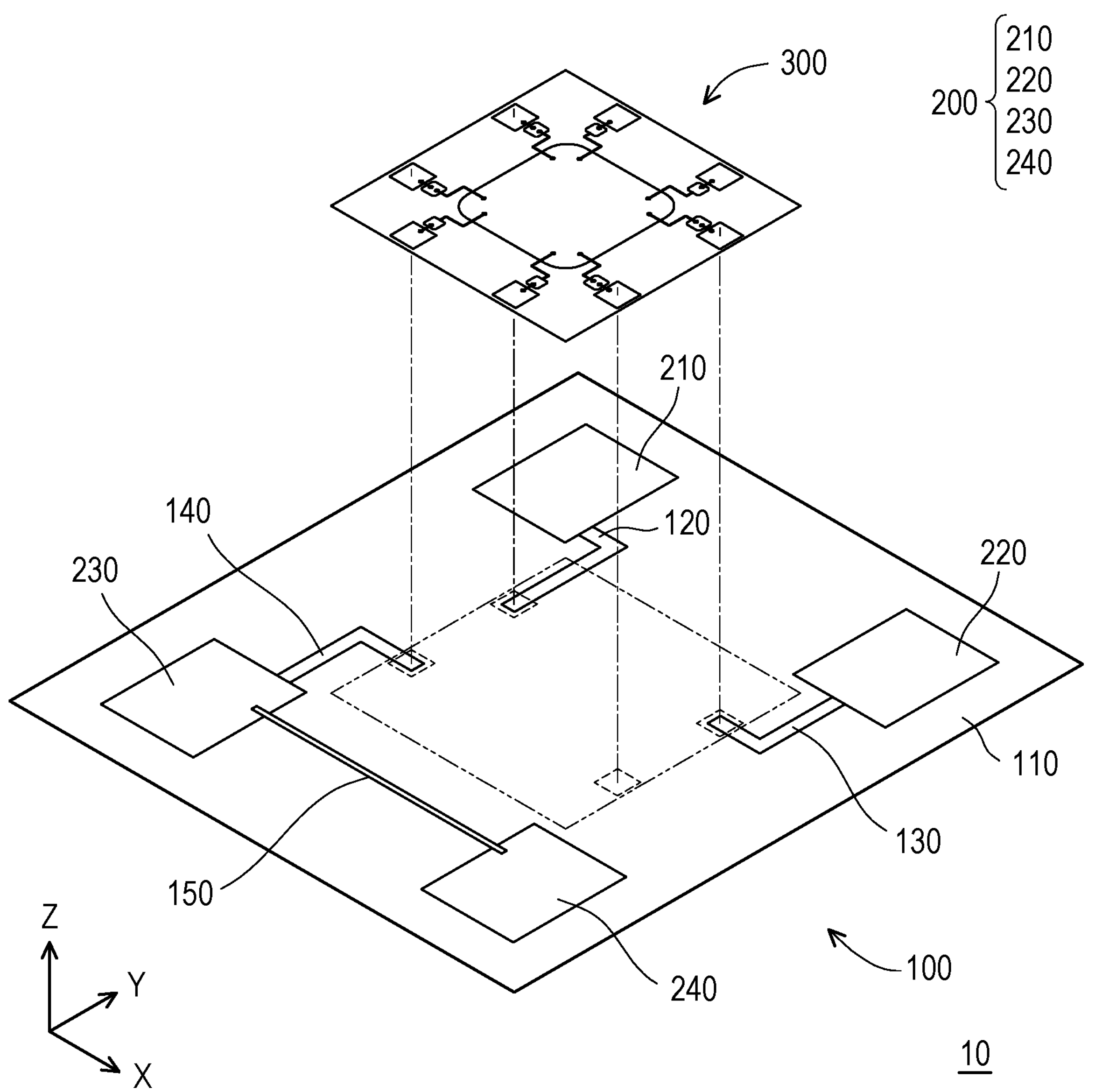
FIG. 1 is a schematic top view of an electronic device according to an embodiment of the disclosure.

The disclosure may be understood by referring to the following detailed description in conjunction with the accompanying drawings. It should be noted that, in order to facilitate understanding and for the concision of the drawings, merely a part of the electronic device is shown in the drawings in the disclosure, and the specific elements in the drawings are not drawn according to the actual scale. In addition, the number and size of each element in the drawings are merely for illustration, and are not intended to limit the scope of the disclosure.

In the following description and claims, the words “comprising” and “including” are open-ended words, and thus should be interpreted as meaning “including but not limited to . . . ”.

It should be understood that when an element or a film layer is referred to as being “on” or “connected to” another element or film layer, the element or film layer may be directly on or directly connected to this other element or film layer, or there is an intervening element or film layer in between (an indirect case). In contrast, when an element is referred to as being “directly on” or “directly connected to” another element or film layer, there are no intervening elements or film layers in between.

Although the terms “first”, “second”, “third” and the like may be used to describe various constituent elements, the constituent elements are not limited to the terms. The terms are merely used to distinguish a single constituent element from other constituent elements in the specification. The same terms may not be used in the claims, and may be replaced with first, second, third and the like in the order in which the elements are declared in the claims. Therefore, in the following description, the first constituent element may be the second constituent element in the claims.

In the text, the terms “about”, “approximately”, “essentially” or “substantially” are generally interpreted as within 10%, or within 5%, or within 3%, or within 2% or within 1%, or within 0.5% of a given value or range. The quantities given here are approximate quantities, that is, in the absence of specific description of “about”, “approximately”, “essentially” or “substantially”, the meaning of “about”, “approximately”, “essentially” or “substantially” may still be implied.

In some embodiments of the disclosure, terms related to bonding and connection, such as “connection”, “interconnection”, etc., unless otherwise specified, may mean that two structures are in direct contact, or may also mean that two structures are not in direct contact, and there are other structures disposed between these two structures. And the terms about joining and connecting may also include the situation that both structures are movable, or both structures are fixed. In addition, the term “coupled” includes any direct or indirect electrical connection means.

In some embodiments of the disclosure, an optical microscope (OM), a scanning electron microscope (SEM), a film thickness profilometer (α-step), an ellipsometer, or other suitable ways may be used to measure the area, width, thickness or height of each element, or the distance or spacing between elements. In detail, according to some embodiments, a scanning electron microscope may be used to obtain a cross-sectional structure image including the element to be measured, and measure the area, width, thickness or height of each element, or the distance or spacing between elements.

The electronic device of the disclosure may include a display device, an antenna device, a packaging device, a sensing device or a splicing device, but is not limited thereto. The electronic device may be a bendable or flexible electronic device. The electronic device may, for example, include liquid crystals, light emitting diodes, which may, for example, include organic light emitting diodes (OLEDs), submillimeter light emitting diodes (mini LEDs), micro light emitting diodes (micro LEDs) or quantum dot light emitting diodes (quantum dots or QDs, which may be, for example, QLEDs or QDLEDs), fluorescence, phosphors or other suitable materials, and the materials may be arranged and combined arbitrarily, but not limited thereto. The antenna device may be, for example, a liquid crystal antenna or an antenna device of Varactor Diodes, but is not limited thereto. The splicing device may be, for example, a display splicing device or an antenna splicing device, but is not limited thereto. The packaging device may be configured in wafer-level packaging (WLP) technology or panel-level packaging (PLP) technology, such as chip-first or RDL-first processes. It should be noted that the electronic device may be any arrangement or combination of the foregoing, but is not limited thereto. Hereinafter, the disclosure is described with an electronic device. However, the disclosure is not limited thereto.

It should be noted that, in the following embodiments, the features of several different embodiments may be replaced, recombined, and mixed to complete other embodiments without departing from the spirit of the disclosure. As long as the features of the various embodiments do not violate the spirit of the disclosure or conflict with each other, they may be mixed and matched at discretion.

Reference is now made in detail to exemplary embodiments of the disclosure, and examples of the exemplary embodiments are illustrated in the accompanying drawings. Wherever possible, the same reference numerals are used in the drawings and descriptions to refer to the same or similar parts.

Figure 2:
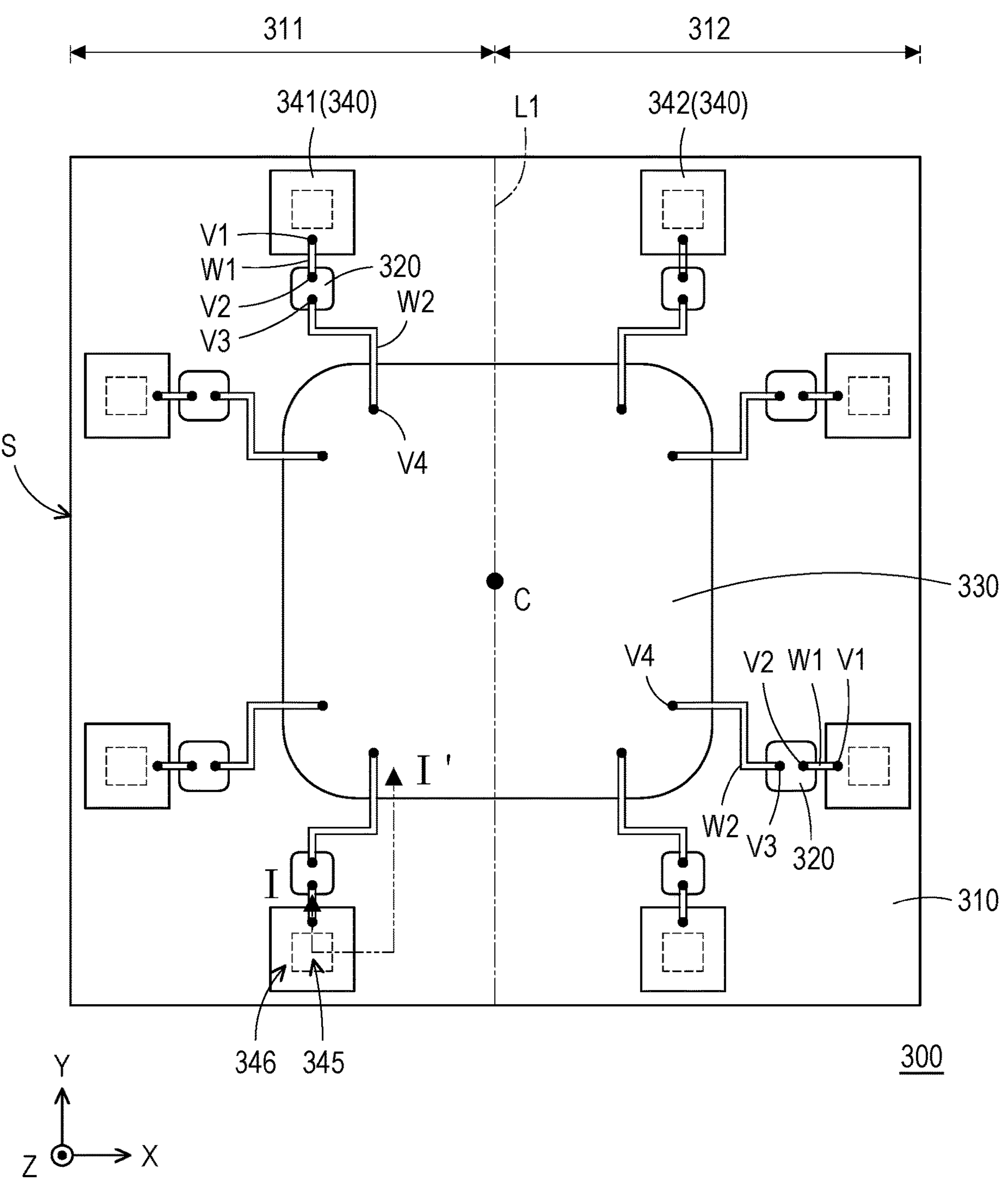
FIG. 2 is an enlarged schematic view of a second substrate structure of the electronic device in FIG. 1.
Figure 3:
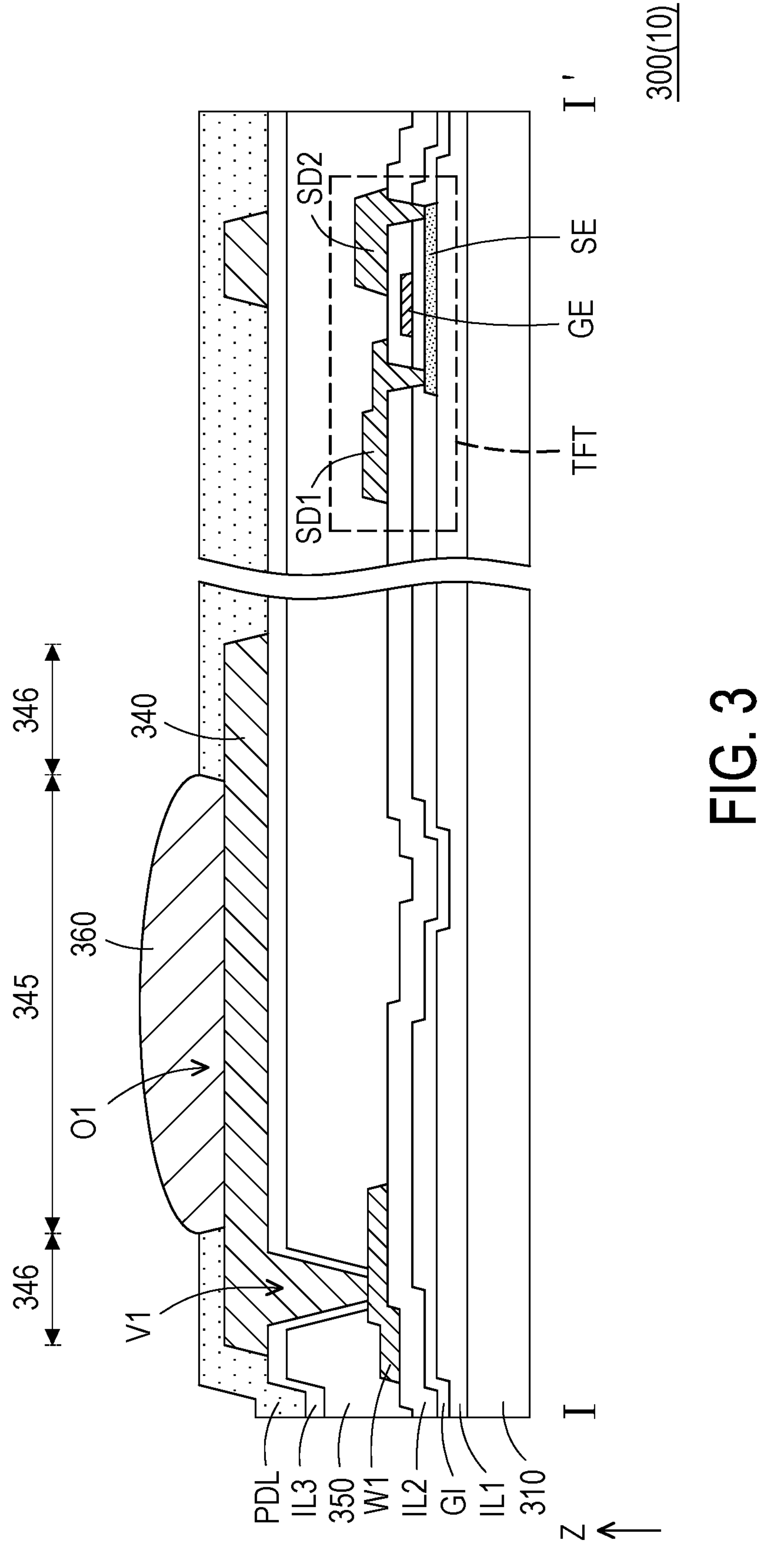
FIG. 3 is a schematic cross-sectional view of the electronic device in FIG. 2 along a section line I-I'.

FIG. 1 is a schematic top view of an electronic device according to an embodiment of the disclosure. FIG. 2 is an enlarged schematic view of a second substrate structure of the electronic device in FIG. 1. FIG. 3 is a schematic cross-sectional view of the electronic device in FIG. 2 along a section line I-I'. FIGS. 4A to 4D are schematic circuit diagrams of protection circuits in electronic devices according to various embodiments of the disclosure. For the clarity of the drawings and the convenience of description, some elements of an electronic device 10 in FIG. 3 are omitted in FIGS. 1 and 2.

Referring to FIGS. 1 to 3, the electronic device 10 of the embodiment may include a first substrate structure 100, multiple electronic elements 200 and a second substrate structure 300. The first substrate structure 100 includes a first substrate 110, a wire 120, a wire 130, a wire 140 and a wire 150, but is not limited thereto. In the embodiment, the first substrate structure 100 may be, for example, a circuit board including a single-layer circuit or a multi-layer circuit. For example, the first substrate structure may be, for example, an active driving substrate configured to drive the electronic elements 200, and the active driving substrate may include driving circuits (not shown) such as transistors, scan lines and data lines, but is not limited thereto. In the embodiment, the first substrate 110 may include a hard substrate, a soft substrate, or a combination thereof. For example, the material of the first substrate 110 may include glass, quartz, sapphire, ceramics, polycarbonate (PC), polyimide (PI), polyethylene terephthalate (PET), other suitable substrates or a combination thereof, but not limited thereto.

The wire 120, the wire 130, the wire 140 and the wire 150 are respectively disposed on the first substrate 110 and electrically connected to corresponding electronic elements 200.

The electronic elements 200 (four are schematically shown in FIG. 1, but not limited thereto) are disposed on the first substrate 110. The electronic elements 200 may, for example, include a first electronic element 210, a second electronic element 220, a third electronic element 230 and a fourth electronic element 240, but are not limited thereto. The first electronic element 210 may be electrically connected to the second substrate structure 300 through the wire 120, the second electronic element 220 may be electrically connected to the second substrate structure 300 through the wire 130, the third electronic element 230 may be electrically connected to the second substrate structure 300 through the wire 140 and the fourth electronic element 240 may be electrically connected to the third electronic element 230 through the wire 150. The electronic elements 200 may be disposed in parallel or in series. For example, the first electronic element 210 and the second electronic element 220 in FIG. 1 are disposed in parallel. For example, the third electronic element 230 and the fourth electronic element 240 are disposed in series. In the embodiment, the electronic element 200 may include a photoelectric element, a pyroelectric element, a piezoelectric element, a sensing element or an antenna element, but is not limited thereto. For example, the electronic element 200 may be, for example, a light emitting diode, a photodiode or a varactor diode, but is not limited thereto. In some embodiments, bonding pads (not shown in FIG. 1) may be provided on the first substrate 110, so that the above-mentioned electronic elements 200 may be electrically connected to the second substrate structure 300 through the wires (120, 130, 140 and 150) and the bonding pads on the first substrate 110.

The second substrate structure 300 may be coupled to the first substrate structure 100. In the embodiment, the second substrate structure 300 may be disposed on the first substrate structure 100, for example. The second substrate structure 300 may include a second substrate 310, a protection circuit 320, a driving circuit 330 and a bonding pad 340, but is not limited thereto.

The second substrate 310 may include a center point C, a center line L1, a side S, a first area 311 and a second area 312. The center point C is located at the center of the second substrate 310. The center line L1 passes through the center point C and is parallel to a direction Y. The center line L1 may divide the second substrate 310 into the first area 311 and the second area 312. The first area 311 is, for example, an area on the left side of the center line L1 of the second substrate 310, and the second area 312 is, for example, an area on the right side of the center line L1 of the second substrate 310, but not limited thereto. In the embodiment, the material of the second substrate 310 may be glass, but is not limited thereto. In some embodiments, the second substrate may also be a hard substrate, a soft substrate, or a combination thereof. For example, the material of the second substrate may also include glass, quartz, sapphire, ceramics, polycarbonate, polyimide, polyethylene terephthalate, other suitable substrates or a combination thereof, but not limited thereto.

In the embodiment, a direction X, the direction Y and a direction Z are different directions respectively. The direction X is, for example, the horizontal direction in FIG. 2, the direction Y is, for example, the vertical direction in FIG. 2 and the direction Z is, for example, the normal direction of the second substrate 310. The direction X may be substantially perpendicular to the direction Y, the direction X may be substantially perpendicular to the direction Z and the direction Y may be substantially perpendicular to the direction Z, but not limited thereto.

The protection circuit 320 is disposed on the second substrate 310. The protection circuit 320 may be disposed between the bonding pad 340 and the driving circuit 330, and the protection circuit 320 may be closer to the bonding pad 340 than the driving circuit 330, but is not limited thereto. The protection circuit 320 may be respectively coupled to the bonding pad 340 and the driving circuit 330. In the embodiment, the protection circuit 320 may be electrically connected to the bonding pad 340 through a via hole V1, a metal trace W1 and a via hole V2, and the protection circuit 320 may be electrically connected to the driving circuit 330 through a via hole V3, a metal trace W2 and a via hole V4, but not limited thereto. In some embodiments, the via hole V1 shown in FIG. 2 may have multiple via holes V1, so that the conductive path and the conductive area of the bonding pad 340 and the metal trace W1 may be increased. The same applies to the bonding pads in the specification, at least one of the bonding pads may include multiple via holes.

In the embodiment, the protection circuit 320 may be configured to reduce or eliminate static electricity from the outside (such as static electricity entering the second substrate structure through the bonding pad, etc.) or static electricity generated internally (such as static electricity generated from the second substrate structure, etc.), so as to reduce the damage of electrostatic discharge to the bonding pad or related elements electrically connected to the bonding pad (e.g., the driving circuit, etc.). The protection circuit 320 may include at least one of a diode, a transistor, a guard ring and a capacitor, and the circuit design of the protection circuit 320 may be, for example, as shown in FIG. 4A, 4B, 4C or 4D, but not limited thereto.

Specifically, referring to FIG. 4A, the protection circuit 320 may include a node 321, a diode 322, a diode 323, a high power supply voltage VDD and a low power supply voltage VSS. The node 321 is disposed between the driving circuit 330 and the bonding pad 340, and the node 321 may be electrically connected to the driving circuit 330 and the bonding pad 340 respectively. The diode 322 is disposed between the node 321 and the high power supply voltage VDD, and the node 321 may be electrically connected to the high power supply voltage VDD through the diode 322. The diode 323 is disposed between the node 321 and the low power supply voltage VSS, and the node 321 may also be electrically connected to the low power supply voltage VSS through the diode 323. With this design, the signal received by the bonding pad 340 may first pass through the node 321 of the protection circuit 320 before entering the driving circuit 330, so that the protection circuit 320 may be used to reduce possible damage caused by electrostatic discharge. For example, when the voltage of the signal is less than the high power supply voltage VDD and greater than the low power supply voltage VSS, the signal may directly enter the driving circuit 330 after reaching the node 321, and the signal does not enter the diode 322 and the diode 323. When the voltage of the signal is greater than the high power supply voltage VDD, after the signal reaches the node 321, a part of the voltage of the signal enters the diode 322 and another part of the voltage of the signal enters the driving circuit 330, thereby reducing or eliminating electrostatic discharge through the high power supply voltage VDD. When the voltage of the signal is less than the low power supply voltage VSS, after the signal reaches the node 321, a part of the voltage of the signal enters the diode 323 and another part of the voltage of the signal enters the driving circuit 330, thereby reducing or eliminating electrostatic discharge through the low power supply voltage VSS.

Referring to FIG. 4B, a protection circuit 320*a* of the embodiment is similar to the protection circuit 320 in FIG. 4A, and the difference between the two is: in the protection circuit 320*a* of the embodiment, the diode 322 and the diode 323 in FIG. 4A are replaced with a transistor 322*a* and a transistor 323*a* respectively.

Referring to FIG. 4C, a protection circuit 320*b* of the embodiment is similar to the protection circuit 320 in FIG. 4A, and the difference between the two is: in the protection circuit 320*b* of the embodiment, the diode 322 and the diode 323 in FIG. 4A are replaced with a P-type channel transistor 322*b* and a transistor 323*b* respectively.

Referring to FIG. 4D, a protection circuit 320*c* of the embodiment is similar to the protection circuit 320 in FIG. 4A, and the difference between the two is: in the protection circuit 320*c* of the embodiment, the diode 322 and the diode 323 in FIG. 4A are replaced with a P-type channel transistor 322*c* and a P-type channel transistor 323*c* respectively.

Referring to FIG. 2 and FIG. 3 again, the driving circuit 330 is disposed on the second substrate 310. The driving circuit 330 may be configured to drive at least a part of the electronic elements 200. In the embodiment, the driving circuit 330 may be, for example, a pixel circuit or a gate driving circuit, but is not limited thereto. The pixel circuit may be, for example, 2T1C, 3T1C, 4T1C, 5T1C, 6T1C, 7T1C, 7T2C, 8T1C, 8T2C and other circuit structures, where T is an active element, and C is a capacitor, but not limited thereto. For example, in the embodiment, the driving circuit 330 may include a transistor TFT. The transistor TFT is disposed on an insulating layer Il1, and the transistor TFT may include a semiconductor SE, a gate GE, a source SD1 and a drain SD2. In some not-shown embodiments, the driving circuit may also include an active element, a passive element and/or a signal line, but is not limited thereto. The active element may include at least one of a diode and a transistor, the passive element may include at least one of a capacitor, a resistor and an inductor and the signal line may include at least one of a scan line, a data line and a power line, but not limited thereto.

In the embodiment, in the top view of FIG. 2, the driving circuit 330 may be, for example, disposed in the middle of the second substrate 310, and the driving circuit 330 may overlap the center point C and the center line L1. In addition, in the top view of FIG. 2 and the cross-sectional view of FIG. 3, the transistor TFT of the driving circuit 330 may not overlap a bonding area 345 of the bonding pad 340, thereby reducing the impact (for example, the risk of causing characteristic changes or structural deterioration of the active element or the passive element and leading to abnormal operation or abnormal power consumption of the active element or the passive element, or the risk of causing damage to the via holes or the metal traces and interrupting signal conduction) of the stress (such as thermal stress, etc.) generated by the bonding pad during the bonding process on the signal conduction of the driving circuit 330.

Referring to FIG. 2 and FIG. 3 again, the bonding pad 340 is disposed on the second substrate 310. The bonding pad 340 may be configured to input or output information. The bonding pad 340 may be electrically connected to the driving circuit 330 through the protection circuit 320. In the top view of FIG. 2, the bonding pad 340 may include a first bonding pad 341 located in the first area 311 and a second bonding pad 342 located in the second area 312, so that the stress generated by the bonding pad 340 during the bonding process may be substantially applied evenly on the first area 311 and the second area 312 of the second substrate 310. The bonding pad 340 has a bonding area 345 and a non-bonding area 346. The non-bonding area 346 may be adjacent to the bonding area 345. A solder ball 360 may contact the bonding area 345 of the bonding pad 340. In some embodiments, the non-bonding area 346 may surround the bonding area 345.

In the embodiment, the arrangement of the bonding pad 340 may be, for example, arranged adjacent to the side S of the second substrate 310, and the center line L1 is regarded as the axis of symmetry so that the position of the first bonding pad 341 of the first area 311 and the position of the second bonding pad 342 of the second area 312 may be substantially symmetrical. The shape of the bonding pad 340 may be, for example, a quadrangle, and the number of the first bonding pads 341 of the first area 311 may be, for example, the same as the number of the second bonding pads 312 of the second area 312, but not limited thereto. In some embodiments, a user may also adjust the arrangement of the bonding pads, the shape of the bonding pads, and/or the number of bonding pads on both sides of the central line (i.e., the first area and the second area) according to design requirements. In some embodiments, the shape of the bonding pad may also be circular, triangular, polygonal or any shape.

In the embodiment, the second substrate structure 300 further includes the insulating layer Il1, a gate insulating layer GI, an insulating layer IL2, the metal trace W1, an insulating layer 350, an insulating layer IL3, a pixel definition layer PDL and the solder ball 360.

Specifically, the insulating layer IL1 is disposed on the second substrate 310. The semiconductor SE is disposed on the insulating layer IL1. The gate insulating layer GI is disposed on the semiconductor SE, and the gate insulating layer GI may cover the semiconductor SE and the insulating layer IL1. The gate GE is disposed on the gate insulating layer GI. The insulating layer IL2 is disposed on the gate GE, and the insulating layer IL2 may cover the gate GE and the gate insulating layer GI. The metal trace W1, the source SD1 and the drain SD2 are disposed on the insulating layer IL2. The source SD1 and the drain SD2 may be electrically connected to the semiconductor SE respectively. The metal trace W1, the source SD1 and the drain SD2 may be in the same layer or in different layers. The metal trace W1, the source SD1 and the drain SD2 may be made of the same material or different materials.

The insulating layer 350 is disposed on the second substrate 310. The insulating layer 350 is disposed on the metal trace W1, the source SD1 and the drain SD2, and the insulating layer 350 may cover the insulating layer IL2. The insulating layer 350 may include the via hole V1, the via hole V2, the via hole V3 and the via hole V4. The via hole V1 may expose a part of the metal trace W1.

The insulating layer IL3 is disposed on the insulating layer 350 and the sidewall of the via hole V1. In some embodiments, the insulating layer IL3 is disposed on the insulating layer 350 and between the insulating layer 350 and the bonding pad 340, and the insulating layer IL3 does not need to be disposed on the sidewall of the via hole V1.

In the cross-sectional view of FIG. 3, the bonding pad 340 is disposed on the insulating layer IL3, and a portion of the bonding pad 340 may further be filled into the via hole V1. In this way, the bonding pad 340 may be electrically connected to the metal trace W1 through the via hole V1. In addition, in the top view of FIG. 2 and the cross-sectional view of FIG. 3, the non-bonding area 346 of the bonding pad 340 may overlap the corresponding via hole V1 to have an overlapping area, and the bonding area 345 of the bonding pad 340 may not overlap the corresponding via hole. V1 and/or the transistor TFT, thereby reducing the impact of the stress (such as thermal stress) generated by the bonding pad in the bonding process on the signal conduction of the via hole V1 and/or the transistor TFT through the bonding area 345.

In some not-shown embodiments, the bonding area 345 of the bonding pad may not overlap the corresponding metal trace W1, so as to reduce the impact (such as the risk of interrupting signal conduction due to the breakage of the metal trace) of the stress (such as thermal stress) generated by the bonding pad during the bonding process on the metal trace W1.

The pixel definition layer PDL is disposed on the bonding pad 340. The pixel definition layer PDL has an opening O1. The opening O1 may expose a portion of the bonding pad 340 and may define the bonding area 345 of the bonding pad 340. The opening O1 may overlap the corresponding bonding area 345 and not overlap the corresponding non-bonding area 346.

The solder ball 360 is disposed in the opening O1 of the pixel definition layer PDL as much as possible, so that the solder ball 360 is disposed on the bonding area 345 of the bonding pad 340. In this way, the impact of the stress (such as thermal stress) generated by the bonding pad during the bonding process on the signal conduction of the via holes, the metal traces, the active element and/or the passive element below the area (such as the non-bonding area 346) other than the bonding area 345 may be reduced. In some embodiments, a large portion of the solder ball 360 may be disposed in the opening O1 of the pixel definition layer PDL, and a small portion of the solder balls 360 may be disposed on the non-bonding area 346 of the bonding pad 340, which may also reduce the impact of the stress (such as thermal stress) generated by the bonding pad during the bonding process on the signal conduction of the via holes, the metal traces, the active element and/or the passive element below the area (such as the non-bonding area 346) other than the bonding area 345.

Other embodiments are listed below for illustration. It should be noted here that the following embodiments use the element numbers and part of the content of the previous embodiments, the same numbers are used to denote the same or similar elements, and descriptions of the same technical content are omitted. For the description of omitted parts, reference may be made to the foregoing embodiments, and the description will not be repeated in the following embodiments.

Figure 5:
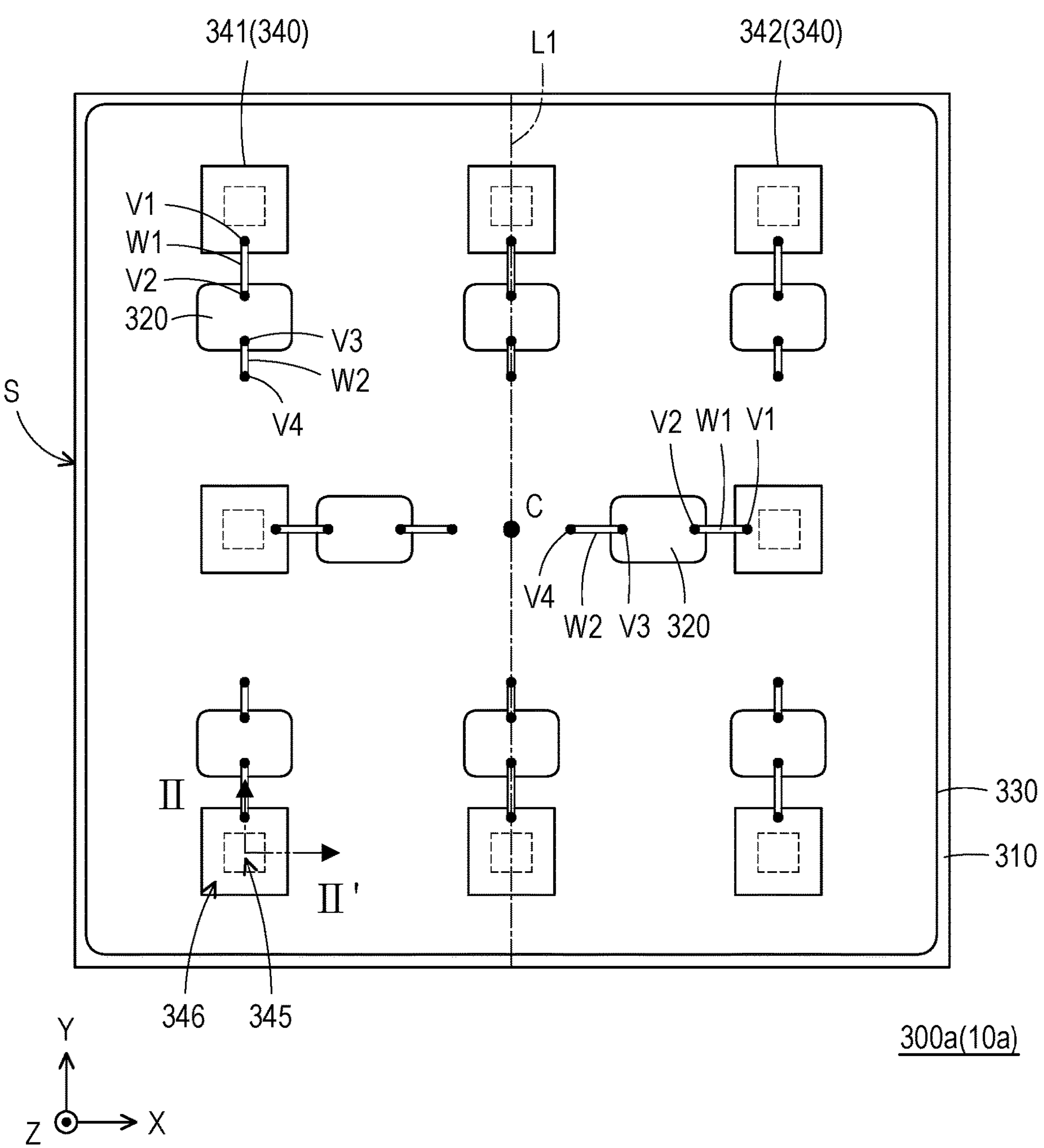
FIG. 5 is a schematic top view of an electronic device according to another embodiment of the disclosure.
Figure 6:
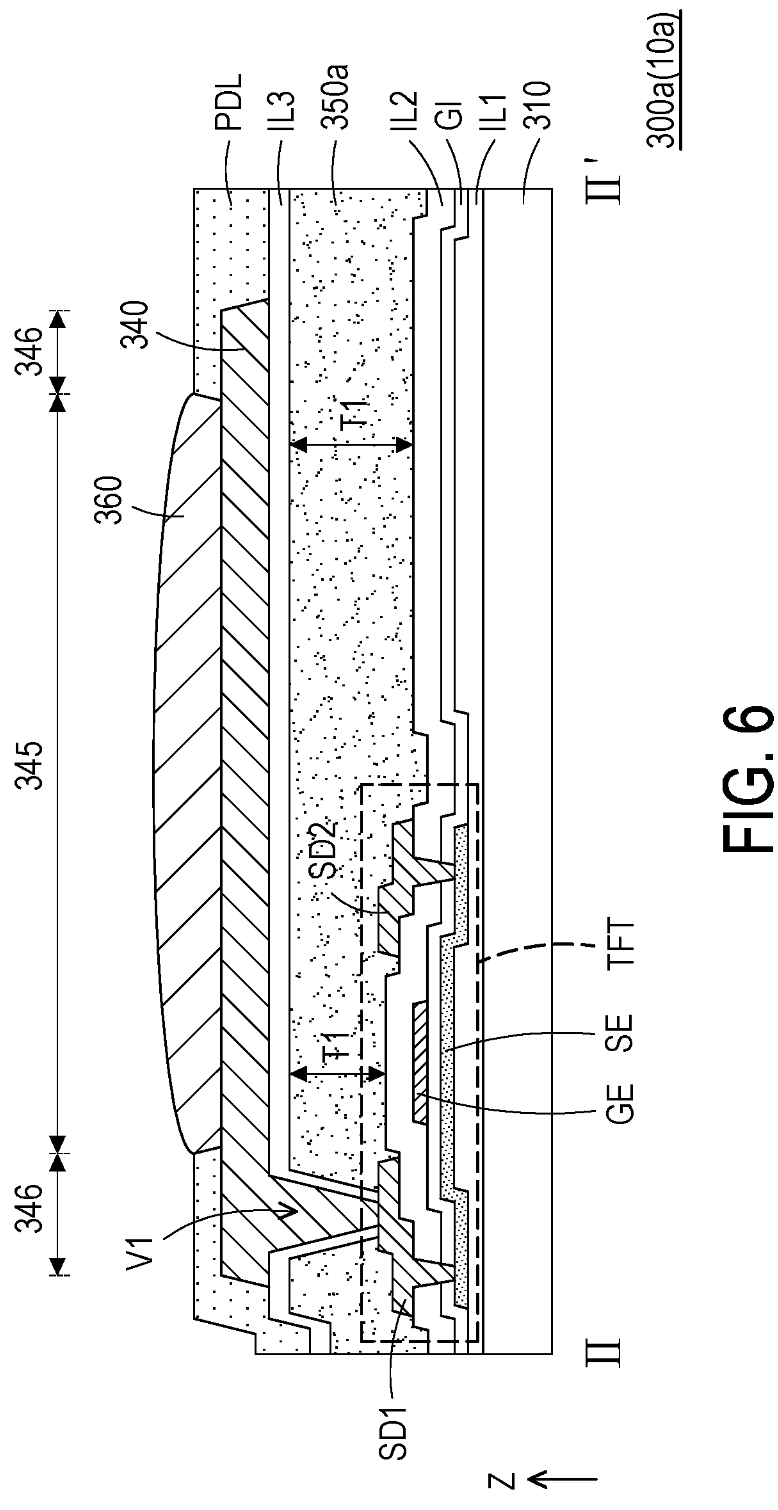
FIG. 6 is a schematic cross-sectional view of the electronic device in FIG. 5 along a section line II-II'.

FIG. 5 is a schematic top view of an electronic device according to another embodiment of the disclosure. FIG. 6 is a schematic cross-sectional view of the electronic device in FIG. 5 along a section line II-II'. For clarity and convenience of illustration, FIG. 5 omits to show some elements of an electronic device 10*a* in FIG. 6. Please refer to FIGS. 2 to 3 and FIGS. 5 to 6 at the same time. The electronic device 10*a* of the embodiment is similar to the electronic device 10 in FIG. 2 to FIG. 3, and the two are slightly different: in a second substrate structure 300*a* of the electronic device 10*a* of the embodiment, a driving circuit 330*a* may overlap the bonding pad 340, and the transistor TFT of the driving circuit 330*a* may overlap the bonding area 345 of the bonding pad 340.

Specifically, referring to FIG. 6, the insulating layer 350 in FIG. 3 is replaced by a stress release layer 350*a*. The stress release layer 350*a* is disposed between the bonding pad 340 and the second substrate 310. The stress release layer 350*a* may be a single-layer structure or a multi-layer structure, and the material of the stress release layer 350*a* includes at least an organic material. When the stress release layer 350*a* is a single-layer structure, the stress release layer 350*a* may be an organic layer, and the material of the stress release layer 350*a* may include photosensitive polyimide (PSPI), other suitable organic materials or a combination thereof, but not limited thereto. When the stress release layer 350*a* is a multilayer structure, the stress release layer 350*a* may be a stack of organic layers and inorganic layers, and the material of the stress release layer 350*a* may include an organic material and an inorganic material (such as silicon nitride or silicon oxide, but not limited thereto).

In the embodiment, the stress release layer 350*a* may have a thickness T1. The thickness T1 is, for example, the thickness measured along the direction Z of the stress release layer 350*a*. In some embodiments, the thickness T1 is, for example, the minimum distance measured along the direction Z between the insulating layer IL3 and the transistor TFT. In the embodiment, when the stress release layer 350*a* is used as a planar layer, the thickness T1 of the stress release layer 350*a* is, for example, 1 micrometer (μm) to 6 μm, but not limited thereto. When the material of the stress release layer 350*a* is photosensitive polyimide, the thickness T1 of the stress release layer 350*a* is, for example, 6 μm to 10 μm, but not limited thereto.

In the embodiment, since the stress release layer 350*a* has the effect of releasing stress, the impact of the stress (such as thermal stress) generated by the bonding pad 340 during the bonding process on the signal conduction of the driving circuit 330*a* therebelow may be reduced by the disposition of the stress release layer 350*a*.

In the embodiment, since the driving circuit 330*a* including the transistor TFT may be disposed below the bonding pad 340, for example, at least part of the transistor TFT of the driving circuit 330*a* in FIG. 6 may overlap the bonding area 345 of the bonding pad 340, that is, the bonding pad 340 overlaps the driving circuit 330*a*, so that the wiring space of the driving circuit 330*a* may be increased.

Figure 7:
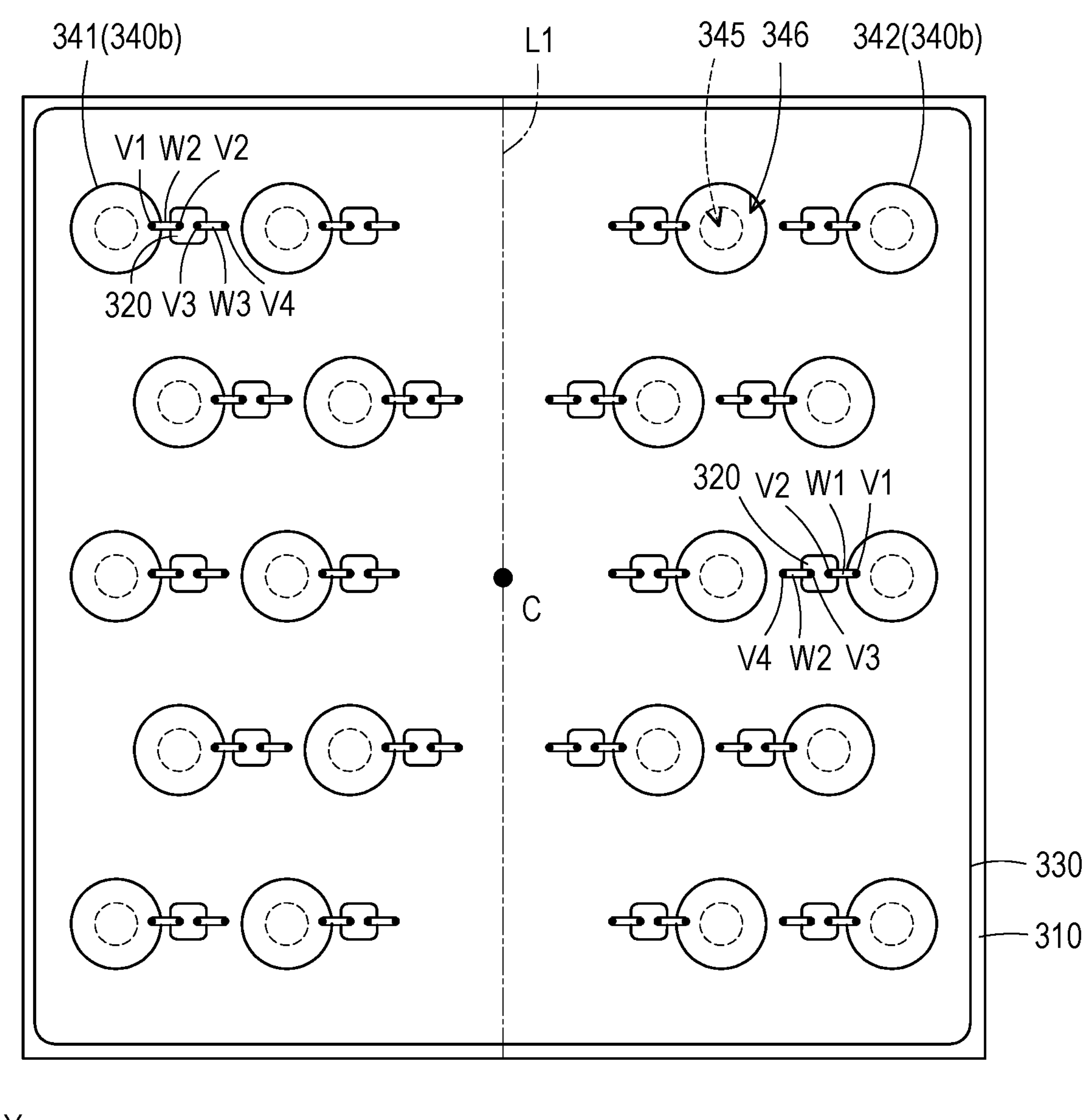
FIG. 7 is a schematic top view of an electronic device according to another embodiment of the disclosure.

FIG. 7 is a schematic top view of an electronic device according to another embodiment of the disclosure. Please refer to FIGS. 7 and 5 at the same time. An electronic device 10*b* of the embodiment is similar to the electronic device 10*a* of FIG. 5, and the two are slightly different: in a second substrate structure 300*b* of the electronic device 10*b* of the embodiment, the shape of a bonding pad 340*b* is circular, and in the left or right area of the central line L1, the arrangement of three adjacent bonding pads 340*b* may draw a triangle. In some embodiments, the shape of the bonding pad may also be triangular, quadrangular, polygonal, or any shape.

Figure 8:
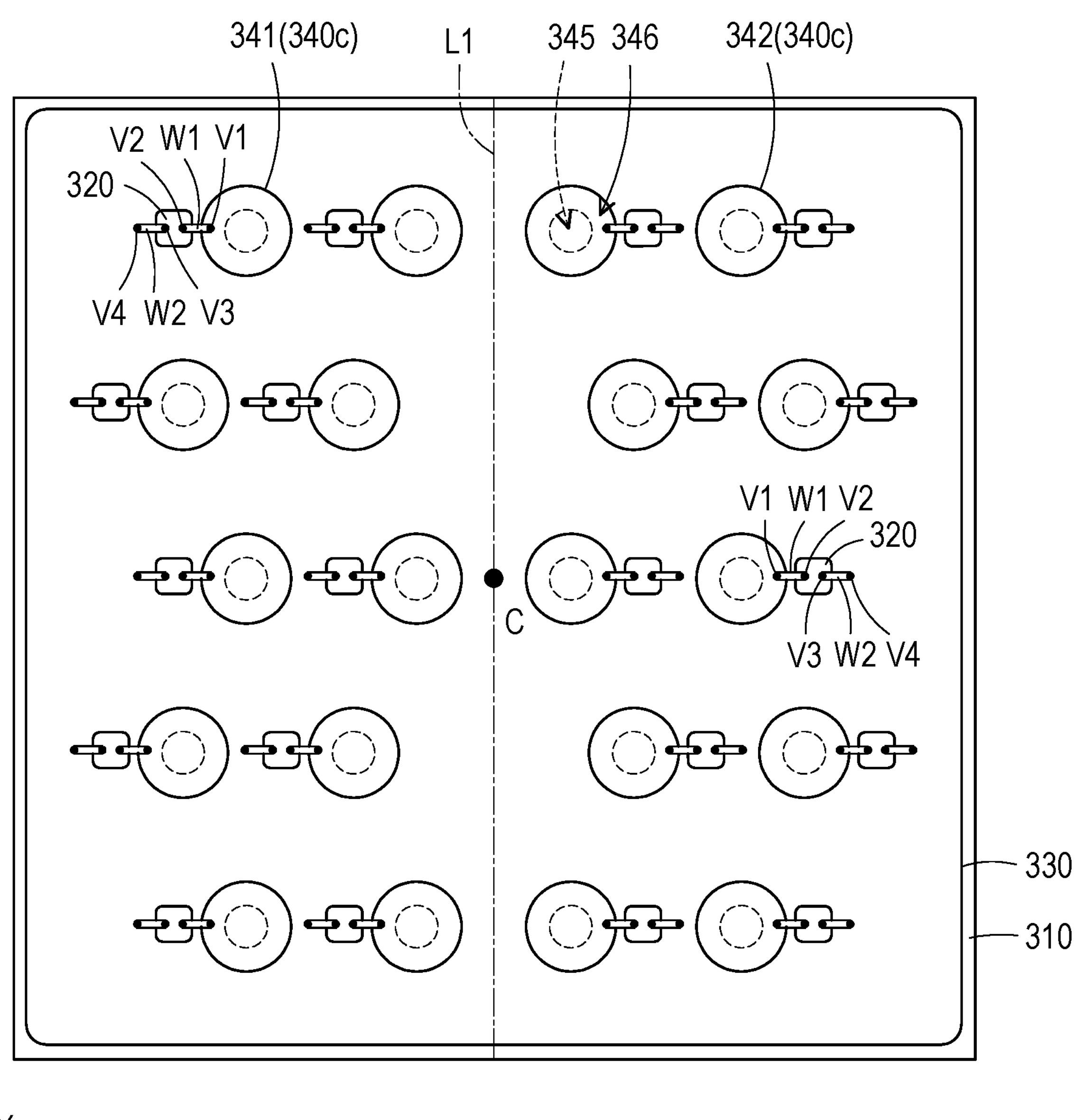
FIG. 8 is a schematic top view of an electronic device according to another embodiment of the disclosure.

FIG. 8 is a schematic top view of an electronic device according to another embodiment of the disclosure. Please refer to FIGS. 8 and 7 at the same time. An electronic device 10*c* of the embodiment is similar to the electronic device 10*b* of FIG. 7, and the two are slightly different: in a second substrate structure 300*c* of the electronic device 10*c* of the embodiment, bonding pads 340*c* are arranged in the form of plum blossom piles. In some embodiments, the shape of the bonding pad may also be triangular, quadrangular, polygonal, or any shape.

Figure 9:
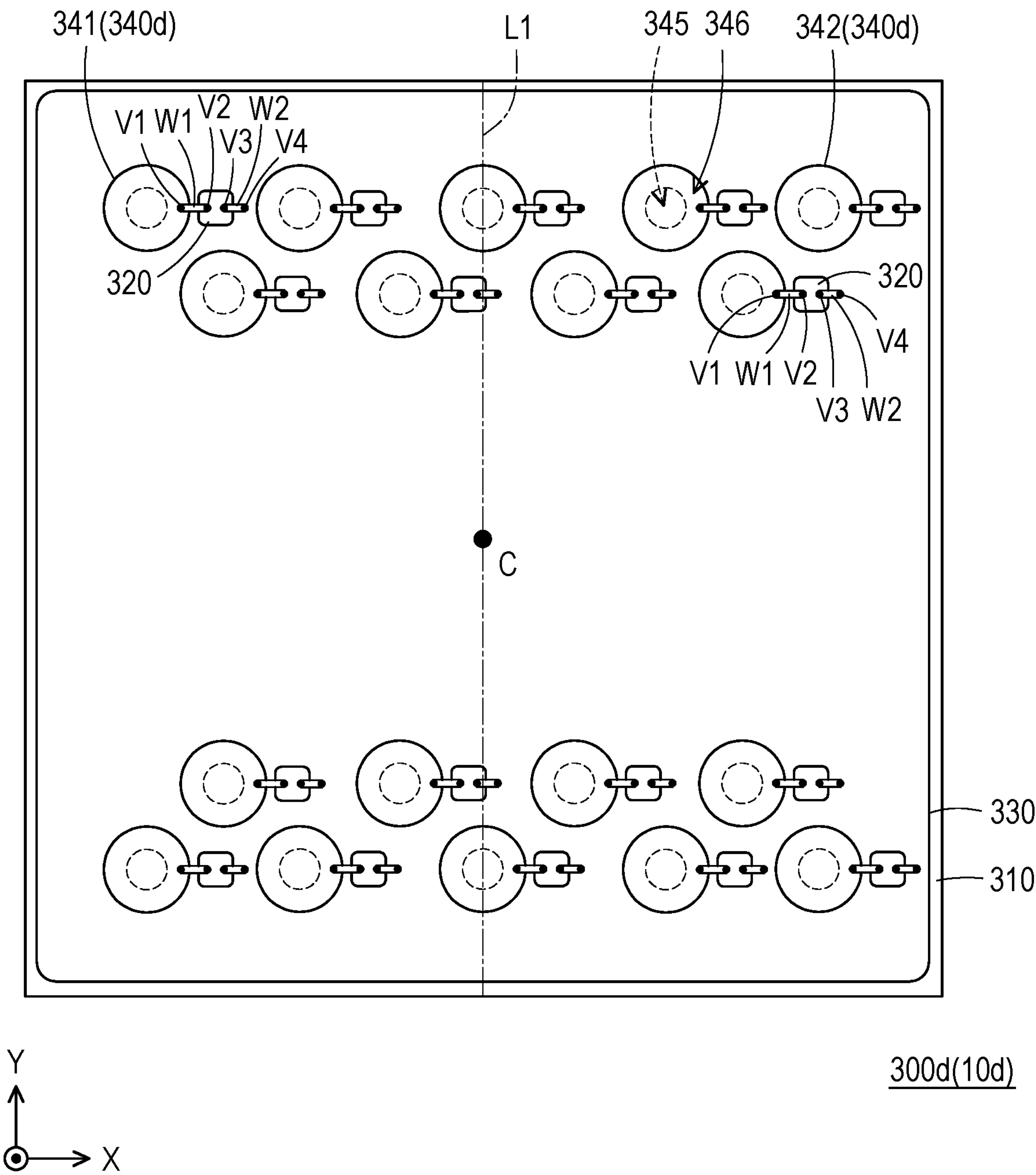
FIG. 9 is a schematic top view of an electronic device according to another embodiment of the disclosure.

FIG. 9 is a schematic top view of an electronic device according to another embodiment of the disclosure. Please refer to FIGS. 9 and 7 at the same time. An electronic device 10*d* of the embodiment is similar to the electronic device 10*b* of FIG. 7, and the two are slightly different: in a second substrate structure 300*d* of the electronic device 10*d* of the embodiment, bonding pads 340*d* are arranged in two types of triangles. For example, one type of triangle has the apex on the top, and the other type of triangle has the apex on the bottom, but not limited thereto. In some embodiments, the shape of the bonding pad may also be triangular, quadrangular, polygonal, or any shape.

To sum up, in the electronic device of the embodiment of the disclosure, the damage of the electrostatic discharge to the bonding pad or related elements (such as the driving circuit, etc.) electrically connected to the bonding pad may be reduced by the disposition of the protection circuit. Since the bonding area of the bonding pad does not overlap the corresponding via hole, the impact of the stress (such as thermal stress, etc.) generated by the bonding pad during the bonding process on the signal conduction of the via hole by the bonding area may be reduced. The impact of the stress (such as thermal stress, etc.) generated by the bonding pad during the bonding process on the signal conduction of the driving circuit therebelow may be reduced by the disposition of the stress release layer.

Finally, it should be noted that the above embodiments are merely used to illustrate the technical solutions of the disclosure, but not to limit the technical solutions of the disclosure. Although the disclosure has been described in detail with reference to the foregoing embodiments, those of ordinary skill in the art should understand that the technical solutions described in the foregoing embodiments may still be modified, or some or all of the technical features thereof may be equivalently replaced. However, these modifications or substitutions do not make the essence of the corresponding technical solutions deviate from the scope of the technical solutions of the embodiments of the disclosure.

What is claimed is:

1. An electronic device, comprising:
- a first substrate structure, comprising a first substrate;
- a plurality of electronic elements, disposed on the first substrate; and
- a second substrate structure, coupled to the first substrate structure and comprising:
  - a second substrate;
  - a protection circuit, disposed on the second substrate;
  - a driving circuit, disposed on the second substrate, and configured to drive at least a part of the plurality of electronic elements; and
  - a bonding pad, disposed on the second substrate,
- wherein the protection circuit is respectively coupled to the bonding pad and the driving circuit,
- wherein an area of the first substrate is larger than an area of the second substrate.

2. The electronic device according to claim 1, wherein the second substrate structure further comprises:

an insulating layer, disposed on the second substrate, and comprising a via hole, wherein in a cross-sectional view, a portion of the bonding pad is filled in the via hole.

3. The electronic device according to claim 2, wherein in a top view, the bonding pad overlaps the via hole and an overlapping area is formed.

4. The electronic device according to claim 3, wherein the bonding pad has a bonding area and a non-bonding area, and the via hole overlaps the non-bonding area.

5. The electronic device according to claim 4, wherein the second substrate structure further comprises:

a metal trace, electrically connected to the bonding pad through the via hole, wherein the metal trace does not overlap the bonding area.

6. The electronic device according to claim 4, wherein the second substrate structure further comprises:

a solder ball, disposed on the bonding area of the bonding pad.

7. The electronic device according to claim 1, wherein the protection circuit is closer to the bonding pad than the driving circuit.

8. The electronic device according to claim 1, wherein the protection circuit comprises a diode, a transistor, a guard ring or a capacitor.

9. The electronic device according to claim 1, wherein the second substrate structure further comprises:

a stress release layer, disposed between the bonding pad and the second substrate, and a material of the stress release layer at least comprising an organic material.

10. The electronic device according to claim 9, wherein the bonding pad overlaps the driving circuit.

11. The electronic device according to claim 1, wherein the bonding pad does not overlap the driving circuit.

12. The electronic device according to claim 1, wherein the bonding pad comprises a plurality of first bonding pads, and the plurality of first bonding pads are arranged on a side of the second substrate.

13. The electronic device according to claim 1, wherein the second substrate comprises a center line, and the bonding pad comprises at least one first bonding pad and at least one second bonding pad, wherein the center line divides the second substrate into a first area and a second area, the at least one first bonding pad is located in the first area, and the at least one second bonding pad is located in the second area.

14. The electronic device according to claim 13, wherein a position of the at least one first bonding pad is symmetrical to a position of the at least one second bonding pad with respect to the center line.

15. The electronic device according to claim 13, wherein a number of the at least one first bonding pad is the same as a number of the at least one second bonding pad.

16. The electronic device according to claim 1, wherein the second substrate structure further comprises:

a pixel definition layer, disposed on the bonding pad and having an opening, wherein the opening exposes a portion of the bonding pad.

17. The electronic device according to claim 1, wherein the electronic element comprises a photoelectric element, a pyroelectric element, a piezoelectric element, a sensing element or an antenna element.

18. The electronic device according to claim 1, wherein the protection circuit comprises a node, a diode, another diode, a high power supply voltage and a low power supply voltage, and the node is electrically connected to the high power supply voltage and the low power supply voltage through the diode and the another diode respectively.

19. The electronic device according to claim 1, wherein the protection circuit comprises a node, a transistor, another transistor, a high power supply voltage and a low power supply voltage, and the node is electrically connected to the high power supply voltage and the low power supply voltage through the transistor and the another transistor respectively.

20. The electronic device according to claim 1, wherein the protection circuit is configured to reduce damage caused by electrostatic discharge.

* * * * *